US005603988A

United States Patent [19]
Shapiro et al.

[11] Patent Number: 5,603,988
[45] Date of Patent: Feb. 18, 1997

[54] METHOD FOR DEPOSITING A TITANIUM OR TANTALUM NITRIDE OR NITRIDE SILICIDE

[75] Inventors: Michael Shapiro, Beacon, N.Y.; Ravi Kanjolia, Andover; Ben C. Hui, Peabody, both of Mass.; Paul F. Seidler, Ridgefield, Conn.; Karen Holloway, Poughkeepsie; Richard Conti, Mount Kisco, both of N.Y.; Jonathan Chapple-Sokol, Essex Junction, Vt.

[73] Assignees: Morton International, Inc., Chicago, Ill.; International Business Machines Corporation, Armonk, N.Y.

[21] Appl. No.: 459,500

[22] Filed: Jun. 2, 1995

[51] Int. Cl.$^6$ ............................ C23C 16/34; C23C 16/42
[52] U.S. Cl. .................... 427/248.1; 427/126.1; 427/255.2; 427/255; 427/226
[58] Field of Search ................................ 427/126.1, 226, 427/248.1, 255.2, 255

[56] References Cited

U.S. PATENT DOCUMENTS

| | | | |
|---|---|---|---|
| 5,178,911 | 1/1993 | Gordon et al. | 427/255.2 |
| 5,344,948 | 9/1994 | Verkade | 556/51 |

OTHER PUBLICATIONS

Laurent et al., "New Journal of Chemistry," vol. 18, No. 5, (1994) pp. 575–580. (month unknown).

Nanula et al., "Preparation of Silicon Nitride—Titanium Nitride and Titanium–Titanium Nitride Composites from $(CH_3)_3$ $SiNHTiCl_3$–Coated $Si_3N_4$ and Ti Particles". J. Am. Ceram. Soc., 78(5), 1247–51, May, 1995.

Sherman, Chemical Vapor Deposition for Microelectronics—Principles, Technology and Applications, Noyes Publications, 1987, pp. 92–117. (month unknown).

Norman et al., New OMCVD Precursors for Selective Copper Metallization, 1991, VMIC Conference, TH–0359–0/91/0000–0123, pp. 123–129. (month unknown).

Ellwanger et al., An Integrated Aluminum/CVD–W Metallization Process for Sub–Micron Contact Filling, 1991, VMIC Conference, TH–0359–0/91/0000–0041, pp. 41–50. (month unknown).

Nishimura et al., Reliable Submicron Vias Using Aluminum Alloy High Temperature Sputter Filling, 1991, VMIC Conference, TH–0359–0/91/0000–0170. (month unknown).

Holl et al., Surface Reactivity of Alkylgold(I) Complexes: Substrate–Selective Chemical Vapor Deposition of Gold from $RAuP(CH_3)_3$ ($R=CH_2CH_3$, $CH_3$) at Remarkably Low Temperatures, Inorganic Chemistry, 1994, 33, pp. 510–517. (month unknown).

Raaijmakers et al., Low Temperature MOCVD of Advanced Barrier Layers for the Microelectronics Industry, Applied Surface Science 73, 1993, pp. 31–41. (month unknown).

Saeki et al., Reaction Process of Titanium Tetrachloride with Ammonia in the Vapor Phase and Properties of the Titanium Nitride Formed, The Chemical Society of Japan, Bull. Chem. Soc. Jpn., 55, 1982, pp. 3193–3196. (month unknown).

Kurtz et al., Chemical Vapor Deposition of Titanium Nitride at Low Temperatures, Thin Solid Films, 140, 1986, pp. 277–290. (month unknown).

Katz et al., Properties of titanium nitride thin films deposited by rapid–thermal–low–pressure–metalorganic–chemical–vapor–deposition technique using tetrakis (dimethylamido) titanium precursor, J. Appl. Phys. 70 (7), Oct. 1991, pp. 3666–3677.

Katz et al., Microstructural study of very low resistivity $TiN_x$ films formed by rapid thermal low–pressure metalorganic chemical vapour deposition onto InP, Semicond. Sci. Technol. 8, 1993, pp. 450–458. (month unknown).

Spee et al., Deposition of titanium nitride thin films at low temperatures by CVD using metalorganic and organometallic titanium compounds as precursors, Journal De Physique IV, 3, Aug. 1993, pp. 289–296.

Winter et al., A Single–Source Precursor to Titanium Nitride Thin Films. evidence for the Intermediacy of Imido Complexes in the Chemical Vapor Deposition Process, J. Am. Chem. Soc., 1992, 114, pp. 1095–1097. (month unknown).

Sandhu et al., Metalorganic chemical vapor deposition of TiN films for advanced metallization, Appl. Phys. Lett., 62 (3), Jan. 1993, pp. 240–242.

Ideka et al., TiN Thin Film Prepared by Chemical Vapor Deposition Method Using $Cp_2Ti(N_3)_2$, Jpn. J. Appl. Phy. 21, Jun., 1993, pp. 3085–3088.

Weiller et al., Flow–Tube Kinetics of Gas–Phase Chemical Vapor Deposition Reactions: TiN from $Ti(NMe_2)_4$ and $NH_3$, Chem. Mater., 1994, 6, pp. 260–261. (month unknown).

Rees, Jr. et al., Synthesis, Characterization and Evaluation of Zinc–Amides as Potential Dopant Sources for ZnSe OMVPE, Materials Research Society Symposium Proceedings, 282, 1993, pp. 63–67 (month unknown).

Schmitz, J. E., Chemical Vapor Deposition of Tungsten and Tungsten Silicides For VLSI/ULSI Applications, Noyes Publications, Park Ridge, New Jersey (1992), pp. 1–9, 95–109 (month unknown).

*Primary Examiner*—Shrive Beck
*Assistant Examiner*—Timothy H. Meeks
*Attorney, Agent, or Firm*—Pollock, Vande Sande & Priddy

[57] ABSTRACT

Titanium and/or tantalum nitrides or nitride silicides are deposited onto a substrate by chemical vapor deposition of a titanium and/or tantalum silylamido complex.

22 Claims, No Drawings

METHOD FOR DEPOSITING A TITANIUM OR TANTALUM NITRIDE OR NITRIDE SILICIDE

DESCRIPTION

1. Technical Field

The present invention is concerned with depositing titanium or tantalum nitride or titanium or tantalum nitride silicide and particularly concerned with a chemical vapor deposition process. The process of the present invention is especially concerned with employing titanium silylamido complexes and/or tantalum silylamido complexes. Examples of suitable complexes are $M(N_w(SiR_3)_x(SiR_2)_y)_z$, and $M(N_w[SiR_3)_x(SiR_2)_y]_z(X)_v$, where $X=NR_2$ or a halogen and mixtures thereof; where w, x, y, z and v individually is an integer 1 to 4, x and y individually is an integer of 0–4, provided that at least one of x and y is at least 1, and M is Ti or Ta or mixtures thereof.

The deposited materials are useful as adhesion and barrier layers in microelectronic circuits.

The present invention is also concerned with substrates coated with titanium or tantalum nitride silicide deposited by the process of the present invention.

2. Background of the Invention

An important component of microelectronic circuits is the multilayer metallization used for device interconnection and wiring. Techniques exist for depositing low-resistivity metal so as to produce the high-aspect-ratio structures required, such as vias and trenches. Examples include chemical or physical vapor deposition of tungsten, copper, gold, or aluminum.

For instance, see Sherman, A.; Chemical Vapor Deposition for Microelectronics; Noyes Publications: Park Ridge, N.J., 1987; Schmitz, J. E. J., Chemical Vapor Deposition of Tungsten and Tungsten Silicides for VLSI/ULSI Applications; Noyes Publications: Park Ridge, N.J., 1991; Norman, J. A. T.; Muratore, B. A.; Dyere, P. N.; Roberts, D. A.; Hochberg, A. K.; in Proc. 8th Int. IEEE VLSI Multilevel Interconnection Conf.; IEEE: New York, N.Y., 1991, p. 123; Ellwanger, R. C.; Broadbent, E. K.; Prall, K. D.; Setalvad, T.; in Proc. 8th Int. IEEE VLSI Multilevel Interconnection Conf.; IEEE: New York, N.Y., 1991, p. 41; Nishimura, H.; Yamada, T.; Ogawa, S.; in Proc. 8th Int. IEEE VLSI Multilevel Interconnection Conf.; IEEE: New York, N.Y., 1991, p. 170; and Banaszak Holl, M. M.; Seidler, P. F.; Kowalczyk, S. P.; McFeely, F. R.; Inorganic Chemistry; 1994, 33 510.

However, all of these conducting materials require prior deposition of an additional material that serves as both an adhesion layer and, more importantly, a barrier layer to prevent diffusion and reactions with the underlying substrate. Ideally, the adhesion or barrier layer should be conformal, continuous and highly conductive. TiN is currently the material of choice for this purpose. While significant effort has been devoted to the deposition of TiN films by chemical vapor deposition (CVD), the known methods are not yet satisfactory for many applications to production device manufacturing.

Along these lines, see Raaijmakers, I. J.; Yang, J.; Appl. Surf. Sci.; 1993 73 31; Saeki, Y.; Matsuzaki, R.; Yajima, A.; Akiyama, M.; Bull. Chem. Soc. Japan; 1982 55 3193; Kurtz, R.; Gordon, R. G.; Thin Solid Films; 1986 140 277; Katz, A.; Feingold, A.; Pearton, S. J.; Nakahara, S.; Ellington, M.; Chakrabarti, U. K.; Geva, M.; Lane, E.; J. Appl. Phys.; 1991 70 3666; Katz, A.; Feingold, A.; Nakahara, S.; Pearton, S. J.; Lane, E.; Jones, K.; Semicond. Sci. Technol.; 1933 8 450; Spee, C. I. M. A.; Linden, J. L.; van der Zouwen-Assink, E. A.; Timmer, K.; Verbeek, F.; Meinema, H. A.; Frigo, D. M.; van der Ven, S.; Journal de Physique IV; 1993 3 289; Winter, C. H.; Sheridan, P. H.; Lewkebandara, T. S.; Heeg, M. J.; Proscia, J. W.; J. Am. Chem. Soc.; 1992 114 1095; Sandhu, G. S.; Meikle, S. G.; Doan, T. T.; Appl. Phys. Lett.; 1993 62 240; Ikeda, K.; Maeda, M.; Arita, Y.; Jpn. J. Appl. Phys.; 1993 32 2085; and Weiller, B. H.; Partido, B. V.; Chem. Mater.; 1994 6 260.

Often, the desired combination of conformality and conductivity cannot be achieved under the required processing parameters of temperature and pressure. Many of the currently used TiN CVD processes involve two precursors, such as $TiCl_4$ and $NH_3$ or $Ti(N(CH_3)_2)_4$ and $NH_3$. The quality of the films deposited is therefore often compromised because of difficulties in controlling gas-phase bimolecular reactions.

Accordingly, an object of the present invention is to provide a process that achieves the desired combination of conformality and conductivity, and does not require more than one precursor.

SUMMARY OF INVENTION

The present invention is concerned with a chemical vapor deposition method for forming a material on a substrate. The material is titanium nitride, titanium nitride silicide, tantalum nitride, or tantalum nitride silicide. If desired, mixtures of these materials can be deposited. The method comprises exposing the substrate to a silylamido complex in the vapor form. The silylamido complex can be a titanium silylamido complex, a tantalum silylamido complex or mixture thereof. During the process, the substrate is at a temperature sufficient to cause the silylamido complex to react and form the desired material.

The present invention is also concerned with substrates coated with titanium or tantalum nitride silicide obtained by the process of the present invention.

BEST AND VARIOUS MODES FOR CARRYING OUT INVENTION

The substrate employed in the present invention can be any suitable substrate upon which one desires to deposit the titanium or tantalum materials, including semiconductors, metallic substrates, insulators and polymeric substrates (e.g., thermoplastic and thermosetting polymers). Preferably, the substrate is a semiconductor material. Suitable substrates include doped silicon, germanium, SiGe, gallium arsenide, or other III-V, II-V or II-VI semiconductor material. Preferably, the substrates are silicon, metal tool bits and blades, polysilicon substrates for thin film transistors, and spin on glasses and polymers.

The present invention involves exposing the substrate to a titanium silylamido complex and/or a tantalum silylamido complex. The complex is deposited in vapor form employing chemical vapor deposition.

The preferred complexes employed, according to the present invention, are represented by the following formulae:

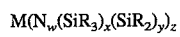   1

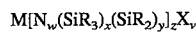   2 wherein M is Ti or Ta or mixtures thereof.

Each R is independently alkyl, aryl, allyl or vinyl. The alkyl groups typically contain 1 to 6 carbon atoms and preferably 1 to 4 carbon atoms. The aryl groups typically contain 6 to 9 carbon atoms. The most preferred R groups are branched alkyl groups, such as isopropyl, isobutyl, t-butyl and neopentyl.

X is $NR_2$ or a halogen such as Cl, Br, and I and preferably are Cl and $NR_2$. Each w, z and v individually is an integer of 1–4; each x and y individually is an integer of 0–4, provided that at least one of x and y is at least 1. More typically, each x and y individually is an integer of 1–4. In formula 1, w is preferably 2, x is preferably 2, y is preferably 1 and z is preferably 2 when M is Ti or Ta. In formula 2 when M is Ti, w is preferably 2, x is preferably 2, y is preferably 1, z is preferably 1, and v is preferably 2; and when M is Ta, w is preferably 2, x is preferably 2, y is preferably 1, z is preferably 1 and v is preferably 3. When M is a mixture of Ti and Ta, v is preferably $\geq 2$ and $\leq 3$.

The temperature of the substrate is that sufficient to cause the complex to react, and thereby form the desired material, and is typically about 200° to about 800° C. and preferably, about 300° C. to about 500° C.

The formation of the nitride and/or silicide involves cleavage of Si—N bonds of the complex, while the TiN or TaN bonds remain intact and/or are reformed. In some instances, some of the silyl groups will remain, thereby leading to titanium nitride silicide or tantalum nitride silicide.

In preferred aspects, the deposition occurs in a "unimolecular fashion."

While use of a second reagent such as $NH_3$ in combination with the titanium or tantalum silylamido complexes is not excluded from the present invention, use of a coreagent is not necessary.

The $NH_3$, when present, is typically used in a ratio of about 10:1 to about 100:1 by volume.

The materials are typically deposited at a rate of about 10 to about 3000 angstroms/minutes. The films are typically about 10 to about 1000 angstroms thick. The temperature of deposition is typically 100° to 800° C. and the pressure is typically 0.1 to 200 torr.

The following table illustrates some preferred structural formulae and compounds employed pursuant to the present invention.

TABLE I

| Chemical | M.P. | B.P. | Decomposes at |
|---|---|---|---|
| 1. $Ti[N_4(SiMe_3)_4(SiMe_2)_2]$ | 194° C. | Sub-70° C./0.05 torr | >910° C. |
| 2. $(NMe_2)_2Ti[(NSiMe_3)_2(SiMe_2)]$ | <20° C. | 60° C./0.1 torr | 170° C. |
| 3. $Cl_2Ti[(NSiMe_3)_2(SiMe_2)]$ | 58° C. | 60° C./0.1 torr | 140° C. |
| 4. $(NEt_2)_2Ti[(NSiMe_3)_2(SiMe_2)]$ | 45° C. | 90° C./0.1 torr | 150° C. |

TABLE I-continued

| Chemical | M.P. | B.P. | Decomposes at |
|---|---|---|---|

[Structural formula 3: a Ti center bridged by two N–SiR₃ groups with two R₂Si units, additional SiR₃ substituents]

[Structural formula 4: a Ti center bridged by N–SiR₃ and R₂Si with two X substituents]

Chemical 1 is represented by formula 3 wherein R is methyl.
Chemical 2 is represented by formula 4 wherein $X=NR_2$ and R=methyl.
Chemical 4 is represented by formula 4 wherein X=N(ethyl)₂ and the other R groups are methyl.
Chemical 3 is represented by formula 4 wherein X is Cl and R is methyl.

Another compound suitable for the present invention is $Ti(N(SiR_3)_2)_4$.

What is claimed is:

1. A chemical vapor deposition method for forming on a substrate a material selected from the group consisting of titanium nitride silicide, tantalum nitride silicide and mixtures thereof, which comprises exposing said substrate to a silylamido complex selected from the group consisting of titanium silylamido complex, tantalum silylamido complex and mixtures thereof, wherein said silylamido complex is in vapor form, and said substrate is at a temperature sufficient to cause cleavage of Si—N bonds of said silylamido complex along with retention of some silyl groups of said silylamido complex to form said material.

2. The method as described in claim 1 where the silylamido complex has the chemical formula $M(N_w(SiR_3)_x(SiR_2)_y)_z$ or $M[N_w(SiR_3)_x(SiR_2)_y]_z(X)_v$ wherein each w, z and v individually is an integer of 1–4;
each x and y individually is an integer of 0–4, provided that at least one of x and y is at least 1;
each X is $NR_2$ or a halogen;
each R individually is alkyl, aryl, allyl or vinyl; and
M=titanium or tantalum or mixtures thereof.

3. The method of claim 2 wherein M is titanium.

4. The method of claim 2 wherein M is tantalum.

5. The method of claim 2 wherein each x and y individually is an integer of 1–4.

6. The method of claim 2 wherein said complex is represented by the formula $Ti(N(SiR_3)_2)_4$.

7. The method of claim 1 wherein said substrate is silicon.

8. The method of claim 1 wherein said temperature is about 200° to about 800° C.

9. The method of claim 1 wherein said temperature is about 300° to about 500° C.

10. The method of claim 1 wherein said material is in the form of a coating having a thickness of about 10 angstroms to about 1000 angstroms.

11. A chemical vapor deposition method for forming on a substrate a material selected from the group consisting of titanium nitride, titanium nitride silicide, and mixtures thereof, which comprises exposing said substrate to a silylamido complex represented by the formula

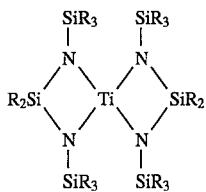 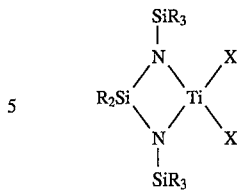

wherein each R individually is alkyl, aryl, allyl or vinyl; wherein said silylamido complex is in vapor form, and said substrate is at a temperature sufficient to cause cleavage of Si—N bonds of said silylamido complex to form said material.

12. The method of claim 11 wherein each R is methyl.

13. The method of claim 11 wherein said alkyl contains 1 to 6 carbon atoms and said aryl contains 6–9 carbon atoms.

14. The method of claim 11 wherein said temperature is about 200° to about 800° C.

15. The method of claim 11 wherein said temperature is about 300° to about 500° C.

16. A chemical vapor deposition method for forming on a substrate a material selected from the group consisting of titanium nitride, titanium nitride silicide, and mixtures thereof, which comprises exposing said substrate to a silylamido complex represented by the formula wherein each X is $NR'_2$ or a halogen and wherein each R and R' individually is alkyl, aryl, allyl or vinyl; and said substrate is at a temperature sufficient to cause cleavage of Si—N bonds of said silylamido complex to form said material.

17. The method of claim 16 wherein X is $NR'_2$ and each R is methyl.

18. The method of claim 16 wherein X is N (ethyl)$_2$ and each R is methyl.

19. The method of claim 16 wherein X is Cl and each R is methyl.

20. The method of claim 16 wherein said alkyl contains 1 to 6 carbon atoms and said aryl contains 6–9 carbon atoms.

21. The method of claim 16 wherein said temperature is about 200° to about 800° C.

22. The method of claim 16 wherein said temperature is about 300° to about 500° C.

* * * * *